(12) United States Patent
Koh et al.

(10) Patent No.: US 7,378,299 B2
(45) Date of Patent: May 27, 2008

(54) LEADLESS SEMICONDUCTOR PACKAGE AND MANUFACTURING METHOD THEREOF

(75) Inventors: Kwang Won Koh, Kaohsiung (TW); Song Woon Kim, Kaohsiung (TW); Sang Bae Park, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 164 days.

(21) Appl. No.: 11/416,102

(22) Filed: May 3, 2006

(65) Prior Publication Data

US 2006/0223238 A1  Oct. 5, 2006

Related U.S. Application Data

(62) Division of application No. 10/811,857, filed on Mar. 30, 2004, now Pat. No. 7,053,469.

(51) Int. Cl.
*H01L 21/00* (2006.01)

(52) U.S. Cl. .................. 438/123; 438/124; 438/126; 257/666

(58) Field of Classification Search .......... 438/123–130
See application file for complete search history.

(56) References Cited

U.S. PATENT DOCUMENTS 5,559,369 A * 9/1996 Newman ............... 257/668
6,229,200 B1 * 5/2001 Mclellan et al. ......... 257/666
6,400,004 B1 * 6/2002 Fan et al. ................ 257/666
6,448,643 B2 * 9/2002 Cheah et al. ............. 257/723
6,452,255 B1 * 9/2002 Bayan et al. ............. 257/666

FOREIGN PATENT DOCUMENTS

| TW | 208794 | 7/2003 |
|----|--------|--------|
| TW | 186089 | 9/2003 |
| TW | 187490 | 10/2003 |
| TW | 194269 | 1/2004 |

* cited by examiner

*Primary Examiner*—Zandra V. Smith
*Assistant Examiner*—Telly D Green

(57) ABSTRACT

A leadless semiconductor package mainly includes a semiconductor device securely attached to an upper surface of a die pad by solder paste and a plurality of leads arranged about the periphery of the die pad. The thickness of the leads and the die pad are within a range of 10 to 20 mils. The semiconductor device is electrically coupled to one of the leads. A package body is formed over the semiconductor device and the leads in a manner that the lower surfaces of the die pad and the leads are exposed through the package body. Preferably, the first semiconductor device is electrically coupled to one of the leads by at least one heavy gauge aluminum wire. The present invention further provides a method of producing the semiconductor package described above.

7 Claims, 3 Drawing Sheets

LEADLESS SEMICONDUCTOR PACKAGE AND MANUFACTURING METHOD THEREOF

RELATED APPLICATIONS

The present application is a divisional application of U.S. patent application Ser. No. 10/811,857, filed Mar. 30, 2004 now U.S. Pat. No. 7,053,469.

BACKGROUND OF THE INVENTION

1. Field of the Invention

This invention relates to lead frame packages, and more specifically to leadless semiconductor packages and manufacturing methods thereof.

2. Description of the Related Art

Lead frame packages have been used for a long period of time in the IC packaging history mainly because of their low manufacturing cost and high reliability. However, as integrated circuits products move its endless pace toward both a faster speed and a smaller size, the traditional lead frame packages have become gradually obsolete for some high performance-required packages. Thus BGA (Ball Grid Array Packages) and CSP (Chip Scale Package) have emerged and become increasingly popular as a new packaging choice. The former has been widely used in IC chips that have higher I/Os and need better electrical and thermal performance than the conventional packages such as CPU and graphic chips. The latter has been widely used in mobile products of which the footprint, package profile and package weight are major concerns.

However, the lead frame package still remains its market share as a cost-effective solution for low I/O ICs. Traditional lead frame package has its limit of providing a solution for chip scale and low profile package due to the long inner leads and outer leads. Therefore, the semiconductor packaging industry develops a leadless package without outer leads such that both the footprint and the package profile can be greatly reduced. FIGS. 1 and 2 show a leadless package 10 wherein the leads 11a are disposed at the bottom of the package as compared to the conventional gull-wing or J-leaded type package. The die pad 11b of the leadless package 10 is exposed from the bottom of the package thereby providing better heat dissipation. Typically, there are four tie bars 11c being connected to the die pad 11b. The leadless package 10 includes a chip 12 sealed in a package body 13. The active surface of the chip 12 is provided with a plurality of bonding pads (not shown) electrically connected to the leads 11a via wire bonding.

Due to the elimination of the outer leads, leadless packages are featured by lower profile and weight. Furthermore, the leadless package 10 is also a cost-effective package due to its use of existing BOM (bill of materials). All the above-mentioned properties make the current leadless packages very suitable for telecommunication products such as cellular phones, portable products such as PDA (personal digital assistant), digital cameras, and IA (Information Appliance).

As the performance requirements for computers and other electronic apparatuses increase, the semiconductor devices operate at higher power and are manufactured at increased device densities. As a result, greater emphasis has been placed on the thermal performance of the semiconductor devices. However, currently available leadless packages fail to meet the high power dissipation requirements of automotive, industrial, and commercial applications.

SUMMARY OF THE INVENTION

The present invention therefore provides a leadless semiconductor package designed to meet the high power dissipation requirements of automotive, industrial, and commercial applications.

Accordingly, in a first aspect, the present invention provides a semiconductor package mainly including a first semiconductor device (such as a power semiconductor device) securely attached to an upper surface of a first die pad by solder paste and a plurality of leads arranged about the periphery of the first die pad. The thickness of the leads and the die pads are within a range of about 10 mils to about 20 mils. The first semiconductor device is electrically coupled to one of the leads. A package body is formed over the semiconductor devices and the leads in a manner that the lower surfaces of the die pad and the leads are exposed through the package body. Preferably, the first semiconductor device is electrically coupled to one of the leads by at least one heavy gauge aluminum wire.

The semiconductor package may further include a second semiconductor device (such as a control semiconductor device) securely attached to a second die pad by silver epoxy. The second semiconductor device is electrically coupled to the leads and the first semiconductor device by a plurality of gold wires.

The package of the present invention can be mounted onto a PC board with the die pads soldered directly to a matching thermal land on the PC board thereby providing a low thermal-impedance path to carry heat generated from the semiconductor devices mounted on the die pads. The use of 10-20 mils thick die pads and heavy gauge aluminum bond wires helps transfer heat from the package while providing low electrical on-resistance.

According to a second aspect of the invention, there is provided a process for making a plurality of semiconductor packages. The method comprises the steps of: (A) providing a lead frame having a thickness between about 10 mils and about 20 mils, the lead frame including a plurality of units in an array arrangement, each unit having a first die pad and a plurality of leads arranged at the periphery of the first die pad, each lead having an half-etched indentation formed corresponding to a predetermined dicing line; (B) attaching a first semiconductor device onto the first die pad of each unit of the lead frame by solder paste; (C) electrically coupling the first semiconductor devices to the leads; (D) forming a molded product by encapsulating the first semiconductor devices against the lead frame to form a plurality of package bodies each encapsulating one of the first semiconductor devices; and (E) cutting the molded product along the half-etched indentations of the leads into individual semiconductor packages by a punch singulation.

BRIEF DESCRIPTION OF THE DRAWING

Other objects, advantages, and novel features of the invention will become more apparent from the following detailed description when taken in conjunction with the accompanying drawings.

DETAILED DESCRIPTION OF THE PREFERRED EMBODIMENT

Figure 1:
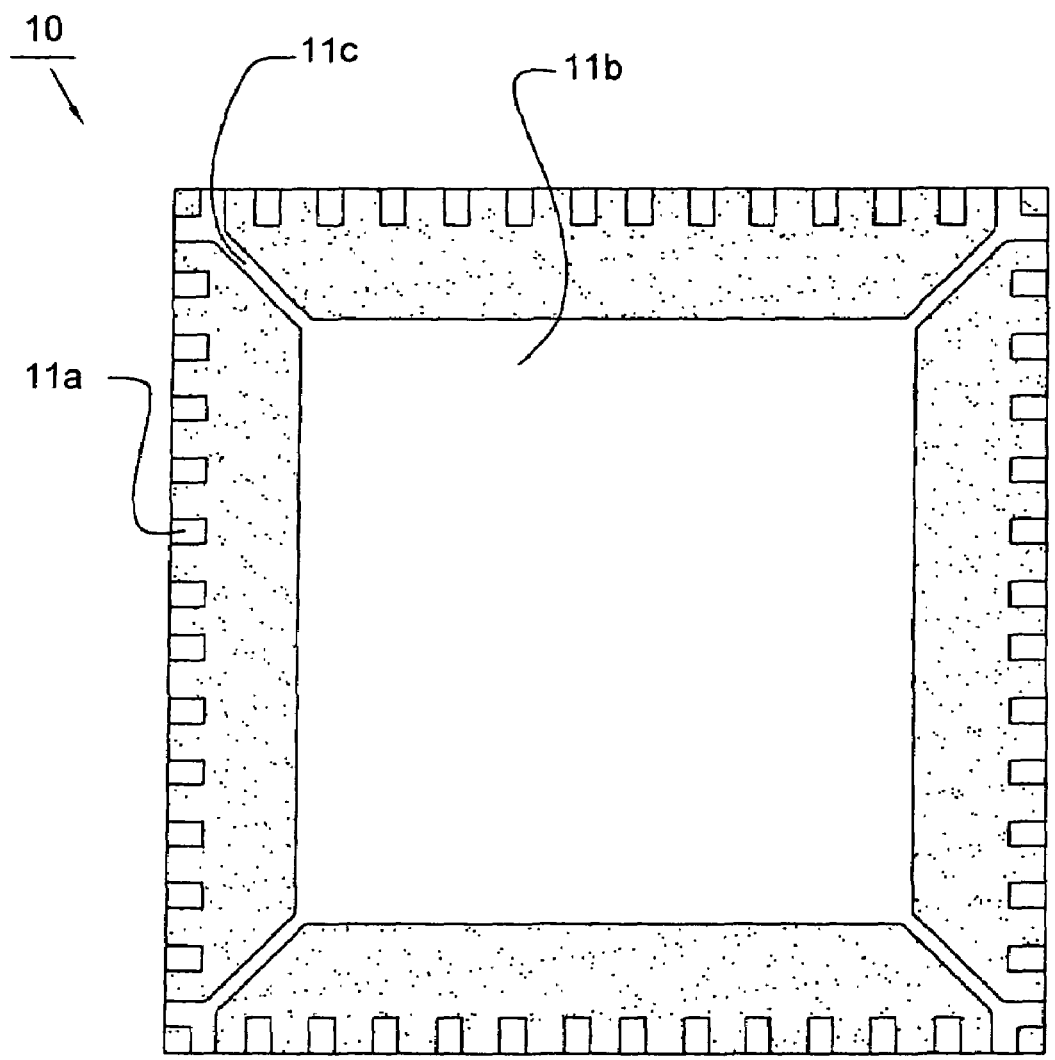
FIG. 1 is a bottom view of a conventional leadless package.
Figure 2:
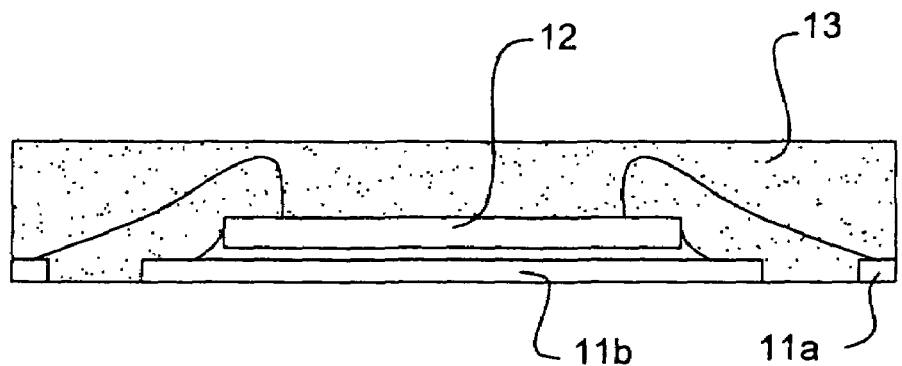
FIG. 2 is a cross-sectional view of the package of FIG. 1.
Figure 3:
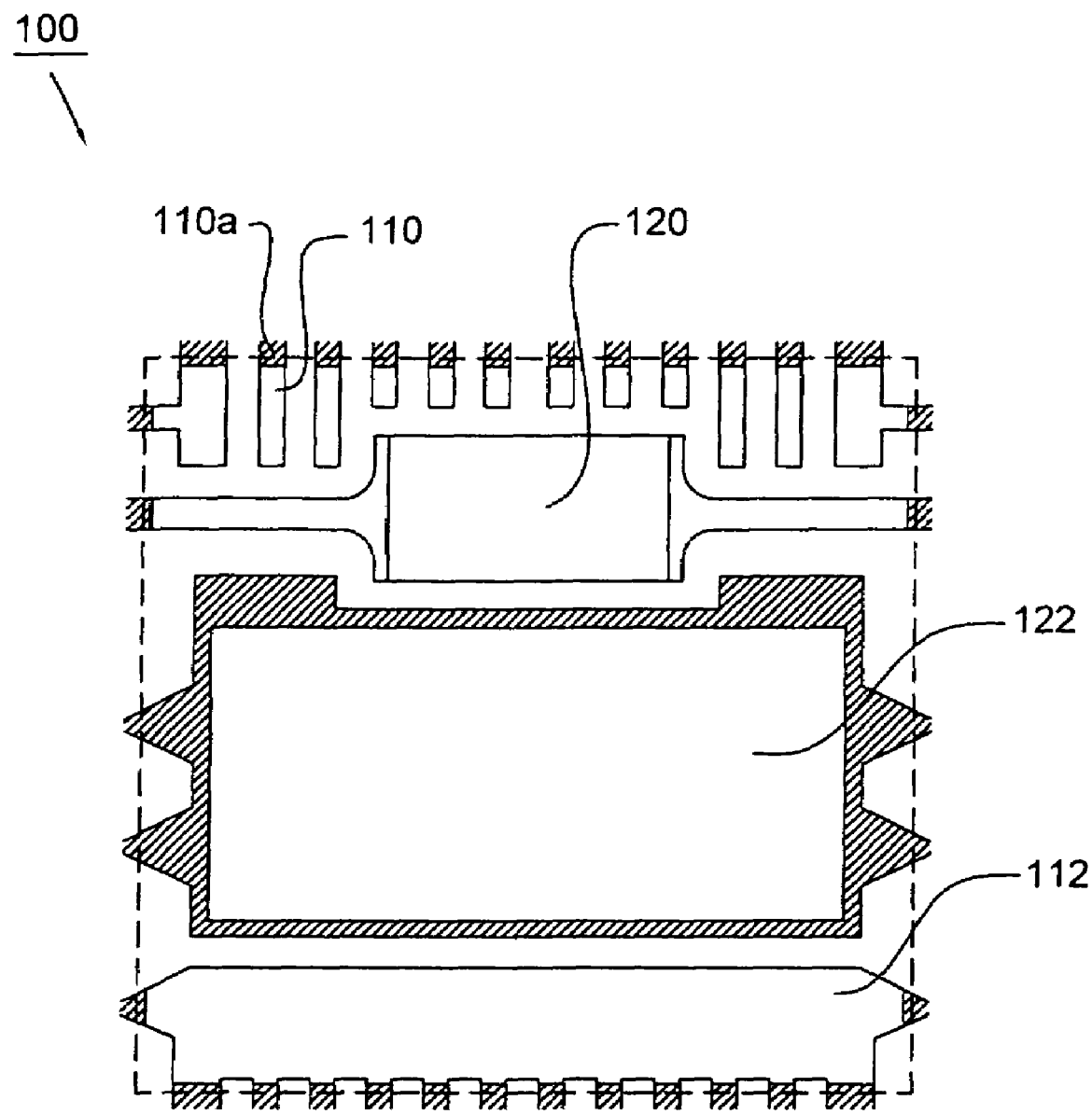
FIG. 3 is a top plan view of a portion of a lead frame according to one embodiment of the present invention.

FIG. 3 shows a top plan view of a portion of a lead frame 100 according to one embodiment of the present invention. The lead frame 100 comprises a plurality of units separated from each other by a plurality of dambars (not shown). Though only one unit of the lead frame 100 is shown in FIG. 3, a lead frame for use with the invention can include any numbers of units that is compatible with the manufacturing equipment, e.g., mold, being used. The dambars generally form an orthogonal grid on the lead frame 100. The lead frame 100 is typically made of a copper-base alloy or made of copper or alloys containing copper. The lead frame 100 have a thickness between about 10 mils and about 20 mils, and is shaped by etching in the manner that each unit of the lead frame 100 has a plurality of leads 110 and a power output bar 112 arranged about the periphery of two die pads 120 and 122. In addition, a half-etched operation is conducted in the manufacturing process of the lead frame 100. The half-etched regions on the lead frame 100 are hatched in FIG. 3 to facilitate understanding. Noted that each lead 110 is half-etched at its bottom surface to form an indentation 110a at a location corresponding to a predetermined dicing line (not shown). It is noted that the "half-etch" herein does not mean only exactly removing a half of the thickness of the lead frame through etching but also includes a partial etching for removing merely a part of the thickness of the lead frame. Lead frames suitable for use in the present invention are available in three lead finishes: post plated SnPb and Matte Sn, and pre plated Ni/Pd with flash of Au (i.e., PPF (Pre-Plating Lead Frame)).

Figure 4:
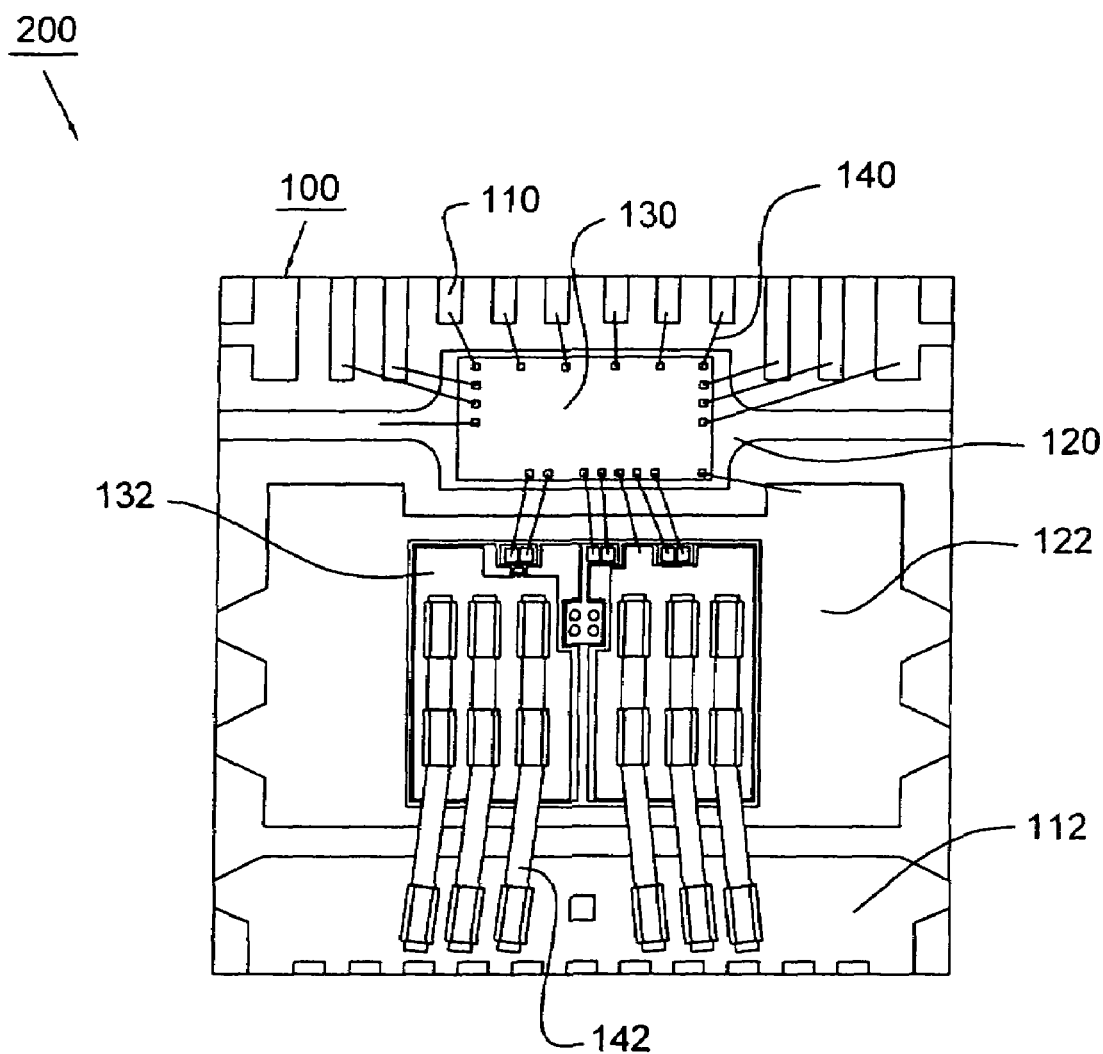
FIG. 4 is a top plan view of a leadless semiconductor package according to one embodiment of the present invention wherein the package body is removed.

FIG. 4 shows a leadless semiconductor package 200 according to one embodiment of the present invention. The package 200 mainly includes a control semiconductor device 130 securely attached to an upper surface of the die pad 120 by silver epoxy and a power semiconductor device 132 securely attached to an upper surface of the die pad 122 by solder paste which provides good electrical and thermal conductivity. Suitable solder paste is a conductive solder alloy containing Sn, Pb, Bi, In, Ag, Au. In a preferred embodiment the solder paste is Sb/Sn based solder with 80% to 97% Sn and the balance mostly Sb. The power semiconductor device 132 may be a high power die to be used in a power amplifier (PA) and the control semiconductor device 130 may be a control die including a control circuitry needed to perform responsive control of the power semiconductor device. The control semiconductor device 130 are electrically coupled to the leads 110 and the power semiconductor device by a plurality of gold wires 140. The power semiconductor device 132 is electrically coupled to the power output bar 112 by heavy gauge aluminum wires 142 (preferably 5-15 mils).

Figure 5:
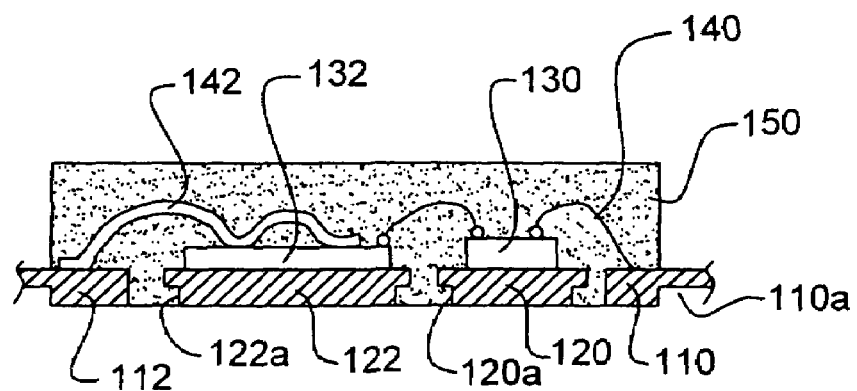
FIG. 5 is a cross-sectional view of the package of FIG. 4 before a punch singulation step is conducted.

Referring to FIG. 5, a package body 150 is formed over the leads 110, the bar 120, the die pads 120, 122 and the semiconductor devices 130, 132. The lower surfaces of the leads 110, the bar 120, and the die pads 120, 122 are exposed from the bottom of the package body 150. The thickness of them are preferably within a range of 10 to 20 mils thereby increasing the area of the interface between the package body 150 and the die pads 120, 122 as well as the leads 110, and prolonging the path and time for moisture diffusion into the package 200. Furthermore, the die pads 120 and 122 are half-etched to form indentations 120a and 122a thereby significantly enhancing the "locking" of the die pad 120 and 122 in the package body 150.

The package 200 can be mounted onto a substrate, such as a printed circuit board (PC board), like other leadless devices. The die pads 120 and 122 are soldered directly to a matching thermal land on the PC board thereby providing a low thermal-impedance path to carry heat generated from the semiconductor devices mounted on the die pads 120 and 122. In the package 200, conduction is the primary modes of heat transfer that moves the generated heat away from the devices 130, 132 and out of the package through exposed die pads 120 and 122 on the bottom surface of the package thereby greatly enhancing the thermal performance of the package. The use of 10-20 mils thick die pads and heavy gauge aluminum bond wires helps transfer heat from the package while providing low electrical on-resistance. Therefore, the leadless semiconductor package of the present invention overcomes the limitations of existing power packages, and meets the high power dissipation requirements of automotive, industrial, marine, and commercial applications.

Although the present invention is discussed in detail with respect to the leadless semiconductor package 200 with two semiconductor devices, a leadless semiconductor package with only one semiconductor device is still considered within the spirit and scope of the invention.

The present invention further provides a process for making the aforementioned leadless semiconductor package. Firstly, in each unit of the lead frame 100, a control semiconductor device 130 is attached to the die pad 120 through silver epoxy and a power semiconductor device 132 is attached to the die pad 122 through solder paste. Preferably, a polyimide (PI) tape (not shown) is attached onto the lower surface of the lead frame 100, and this is to prevent the mold flash problem in the molding process. After that, a regular wire-bonding process is performed to make Au wire interconnections between the control semiconductor device 130 and the leads 110 of the lead frame 100 as well as the power semiconductor device 132 (see FIG. 4). In addition, Al wire bonding between the power semiconductor device 132 and the power output bar 112 (see FIG. 4) is performed using an ultrasonic aluminum wedge bonder.

Then, referring to FIG. 5, a molded product is formed by encapsulating the control semiconductor devices 130 and the power semiconductor devices 132 against the lead frame 100 to form a plurality of package bodies (only one shown in FIG. 5) each encapsulating one of the control semiconductor devices 130 and one of the power semiconductor devices 132.

Thereafter, a singulation step is conducted to cut the aforementioned molded product into individual leadless semiconductor packages. Since the lead frame 100 have a thickness between about 10 mils and about 20 mils, the singulation step is conducted by cutting at the half-etched regions on the lead frame 100, e.g., the indentations 110a of the leads 110, so as to enhance the package integrity. When an individual molding process is used to form the molded product, the singulation step is conducted by a punching operation. Alternatively, when an overmolding process is used to form the molded product, the singulation step is conducted by sawing the molded product from the lower surface (from which one surfaces of the die pads 120, 122 and the leads 110 are exposed) thereof to the upper surface thereof.

Although the invention has been explained in relation to its preferred embodiment, it is to be understood that many other possible modifications and variations can be made without departing from the spirit and scope of the invention as hereinafter claimed.

What is claimed is:

1. A process for making a plurality of semiconductor packages, comprising the following steps:
   providing a lead frame having a thickness between about 10 and about 20 mils, the lead frame including a plurality of units in an array arrangement, each unit having first and second die pads, and an output bar and a plurality of leads arranged at the periphery of the die pads, each lead having an half-etched indentation formed corresponding to a predetermined dicing line;
   attaching a first semiconductor device onto the first die pad of each unit of the lead frame by solder paste;
   attaching a second semiconductor device onto the second die pad of each unit of the lead frame by silver epoxy;
   electrically coupling the first semiconductor device to the output bar;
   electrically coupling the second semiconductor device to the leads and the first semiconductor device;
   forming a molded product by encapsulating the semiconductor devices against the lead frame to form a plurality of package bodies each encapsulating the first semiconductor device and the second semiconductor device; and
   cutting the molded product along the half-etched indentations of the leads into individual semiconductor packages.

2. The process as claimed in claim 1, wherein the first semiconductor device is electrically coupled to the output bar by at least one heavy gauge aluminum wire.

3. The process as claimed in claim 1, wherein the second semiconductor device is electrically coupled to the leads and the first semiconductor device by a plurality of gold wires.

4. The process as claimed in claim 1, wherein the first semiconductor device is a power semiconductor device and the second semiconductor device is a control semiconductor device.

5. The process as claimed in claim 1, wherein the cutting step comprises a step of sawing the molded product into individual semiconductor packages.

6. The process as claimed in claim 1, wherein the molded product has opposing upper and lower surfaces, one surfaces of the die pads and the leads are exposed from the lower surface of the molded product and the cutting step comprises a step of sawing the molded product into individual semiconductor packages from the lower surface of the molded product to the upper surface of the molded product.

7. The process as claimed in claim 1, wherein the cutting step comprises a step of punching the molded product into individual semiconductor packages.

* * * * *